United States Patent
Rivaud et al.

(10) Patent No.: US 9,843,439 B2
(45) Date of Patent: Dec. 12, 2017

(54) SYSTEM AND METHOD FOR MANAGING HOLDOVER

(71) Applicants: Daniel Rivaud, Ottawa (CA); Kevin Estabrooks, Nepean (CA); Bashar Abdullah, Kanata (CA)

(72) Inventors: Daniel Rivaud, Ottawa (CA); Kevin Estabrooks, Nepean (CA); Bashar Abdullah, Kanata (CA)

(73) Assignee: Ciena Corporation, Hanover, MD (US)

( * ) Notice: Subject to any disclaimer, the term of this patent is extended or adjusted under 35 U.S.C. 154(b) by 60 days.

(21) Appl. No.: 15/007,967

(22) Filed: Jan. 27, 2016

(65) Prior Publication Data

US 2017/0214516 A1   Jul. 27, 2017

(51) Int. Cl.

| | |
|---|---|
| *H04L 7/033* | (2006.01) |
| *H04B 15/06* | (2006.01) |
| *H04L 12/24* | (2006.01) |
| *H04L 1/00* | (2006.01) |
| *H04L 29/02* | (2006.01) |

(52) U.S. Cl.
CPC ............ *H04L 7/033* (2013.01); *H04B 15/06* (2013.01); *H04L 1/0082* (2013.01); *H04L 29/02* (2013.01); *H04L 41/06* (2013.01); *H04M 2250/10* (2013.01)

(58) Field of Classification Search
CPC ....... H04L 7/033; H04L 1/0082; H04L 29/02; H04L 41/06; H04B 15/06; H04M 2250/10
See application file for complete search history.

(56) References Cited

U.S. PATENT DOCUMENTS

| 5,883,533 | A | * | 3/1999 | Matsuda | H03L 7/143 327/156 |
|---|---|---|---|---|---|
| 6,968,027 | B2 | * | 11/2005 | Fukuhara | H03L 7/081 327/156 |
| 2006/0171496 | A1 | * | 8/2006 | Nakamuta | H03L 7/085 375/376 |
| 2009/0102569 | A1 | * | 4/2009 | McCoy | H03L 7/143 331/1 A |

(Continued)

OTHER PUBLICATIONS

Semtech Corporation; "Holdover—Who needs it?"; Nov. 5, 2014 (21 pages).

(Continued)

*Primary Examiner* — Freshteh N Aghdam
(74) *Attorney, Agent, or Firm* — Osha Liang LLP

(57) ABSTRACT

A system for managing holdover. The system may include a local oscillator device. The system may include a phase locked loop (PLL) device coupled to the local oscillator device and a reference clock source. The PLL device may obtain a reference clock signal from the reference clock source to produce an extracted clock signal. The system may include a drift monitoring device coupled to the local oscillator device and the PLL device. The drift monitoring device may determine an amount of oscillator drift within the local oscillator device using the extracted clock signal and an oscillator signal from the local oscillator device. The system may include a drift compensation device coupled to the drift monitoring device and the PLL device. The drift compensation device may transmit a drift compensation signal to the PLL device based on the amount of oscillator drift.

14 Claims, 6 Drawing Sheets

(56) References Cited

U.S. PATENT DOCUMENTS

2013/0191679 A1* 7/2013 Zhuang ................ H03L 7/0807
　　　　　　　　　　　　　　　　　　　　　713/503
2016/0013929 A1* 1/2016 Takanashi ................ H03L 7/07
　　　　　　　　　　　　　　　　　　　　　375/375

OTHER PUBLICATIONS

Steven McQuarry; "Intro to Timing Synchronization Fundamentals"; Jun. 3, 2013 (42 pages).

* cited by examiner

SYSTEM AND METHOD FOR MANAGING HOLDOVER

BACKGROUND

Synchronization operations may be performed within a network to ensure different network elements operate concurrently with other network elements. For example, network elements may operate with different clock rates. However, the rate differential between the different clock rates may be necessary to be within a tolerance of a specific application's clock synchronization. When the different clock rates exceed the tolerance of the application, the application may degrade accordingly.

SUMMARY

In general, in one aspect, embodiments relate to a system for managing holdover. The system includes a local oscillator device. The system further includes a phase locked loop (PLL) device coupled to the local oscillator device and a reference clock source. The PLL device obtains a reference clock signal from the reference clock source to produce an extracted clock signal. The system further includes a drift monitoring device coupled to the local oscillator device and the PLL device. The drift monitoring device determines an amount of oscillator drift within the local oscillator device using the extracted clock signal and an oscillator signal from the local oscillator device. The system further includes a drift compensation device coupled to the drift monitoring device and the PLL device. The drift compensation device transmits a drift compensation signal to the PLL device based on the amount of oscillator drift.

In general, in one aspect, embodiments relate to a method for managing holdover. The method includes obtaining an oscillator signal from a local oscillator device. The method further includes obtaining a first extracted clock signal from a phase locked loop (PLL) device. The method further includes determining, using the oscillator signal and the first extracted clock signal, an amount of oscillator drift for the local oscillator device. The method further includes detecting that a connection is terminated over a network between the PLL device and a master clock reference. The method further includes determining, in response to detecting that the connection is terminated and using the amount of oscillator drift, a drift compensation signal. The method further includes transmitting the drift compensation signal to the PLL device. The method further includes generating, from the PLL device and using the drift compensation signal, a second extracted clock signal, wherein the drift compensation signal compensates the second extracted clock signal for the amount of oscillator drift.

In general, in one aspect, embodiments relate to a method for managing holdover. The method includes obtaining an oscillator signal from a local oscillator device. The method further includes obtaining an extracted clock signal from a phase locked loop (PLL) device. The method further includes determining, using the oscillator signal and the extracted clock signal, an amount of oscillator drift for the local oscillator device. The method further includes determining, using the amount of oscillator drift, an amount of holdover time for the PLL device. The method further includes determining, based on the amount of holdover time, a holdover alarm threshold. The method further includes transmitting, to a computing device and in response to the local oscillator device reaching the holdover alarm threshold, a holdover alarm signal.

Other aspects of the invention will be apparent from the following description and the appended claims.

DETAILED DESCRIPTION

Figure 1:
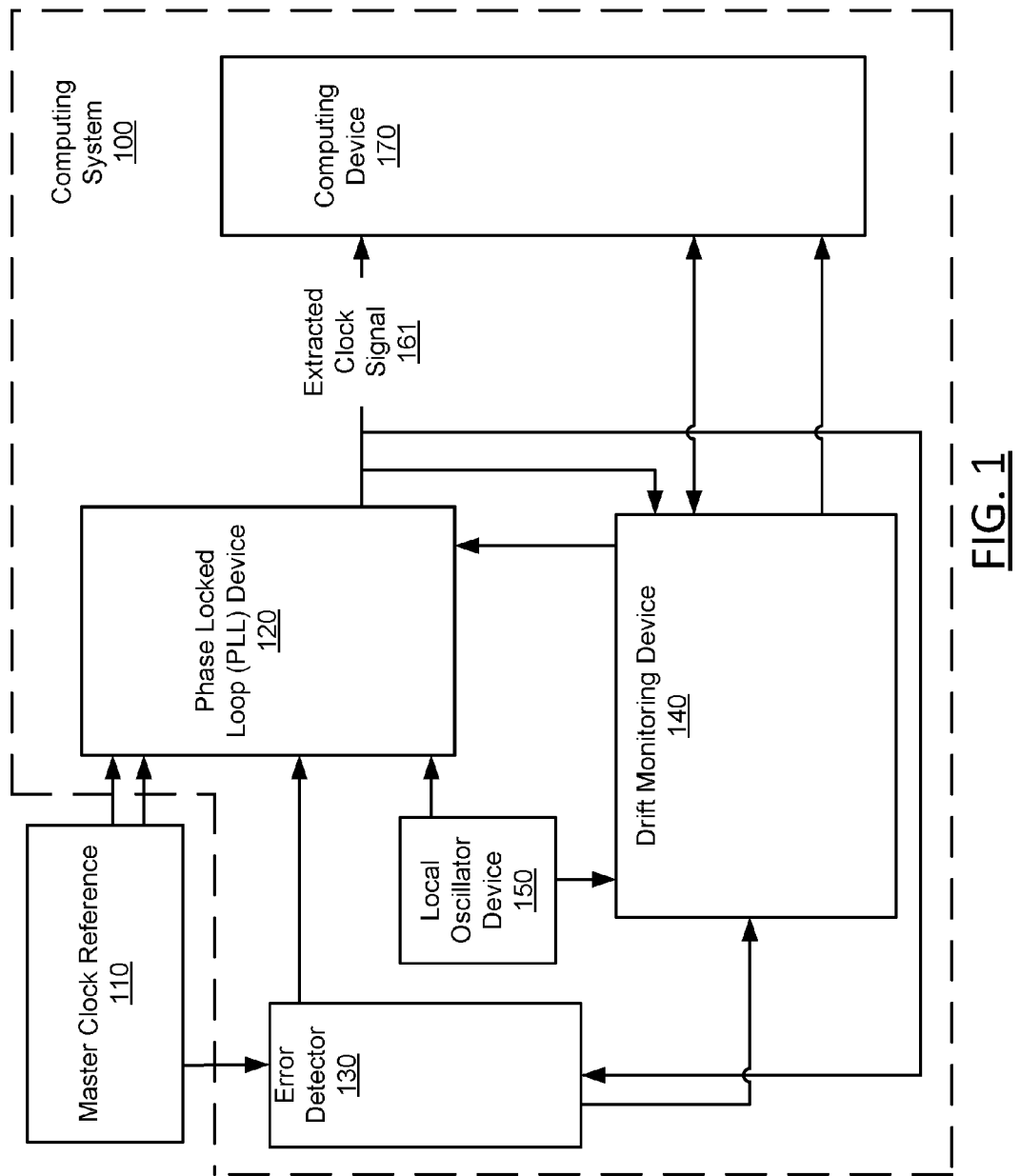
FIGS. 1 and 2 show systems in accordance with one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention include a system and various methods for managing holdover. Holdover may describe a period of time when a computing system becomes disconnected from a reference clock source, e.g., by a natural disaster. The reference clock source may be a clock source located on a master clock or any clock reference source with higher priority (e.g., a clock source with better accuracy) than a local oscillator device. During holdover, a phase locked loop (PLL) device may obtain an extracted clock signal using an oscillator signal from the local oscillator device instead of a reference clock signal from the reference clock source. Accordingly, one or more embodiments are directed to a system that includes a PLL device, a local oscillator device, and a drift monitoring device. Using the frequency error measured between an extracted clock signal and an oscillator signal from the local oscillator device, the drift monitoring device may determine an amount of oscillator drift or aging drift inside the local oscillator device. In one or more embodiments the system may further include a drift compensation device that transmits, during holdover, a drift compensation signal based on the amount of oscillator drift to the PLL device. Thus, the drift compensation signal may compensate for frequency error produced by an oscillator signal from the local oscillator device resulting from the oscillator drift. One or more embodiments are also directed to a system that includes a holdover monitoring device that determines an amount of holdover time existing for a computing system based on the amount of oscillator drift.

FIG. 1 shows a block diagram of a system in accordance with one or more embodiments. In one or more embodiments, as shown in FIG. 1, a computing system (100) is operably connected to a master clock reference (110) (also called a "grandmaster GM"). The master clock reference (110) may be software and/or hardware that includes functionality to generate and transmit synchronized timing information throughout a network (not shown). The master clock reference (110) may be a single network element on the network or distributed over several network elements as a software-defined solution on the network. The computing system (100) may be a network element on the network that has a synchronized clock cycle with other network elements in the network. Thus, the master clock reference (110) may include functionality to provide a reference clock signal to the computing system (100) while being external to the computing system (100). For more information on the computing system (100), see FIG. 6 and the accompanying description.

The computing system (100) may include a phase locked loop (PLL) device (120), an error detector (130), a local oscillator device (150), a drift monitoring device (140), and a computing device (170). The PLL device (120) may be software and/or hardware that includes functionality to generate an extracted clock signal (161) using the master clock reference (110) and/or the local oscillator device (150). For example, the PLL device (120) may be a physical circuit that synchronizes the frequency and/or phase of the extracted clock signal (161) with an input signal from the master clock reference (110) and/or the local oscillator device (150). The PLL device (120) may include a phase frequency detector that produces a phase error signal as well as a frequency error signal between two input signals, such as a reference clock signal and an extracted clock described below. The PLL device (120) may also include a loop filter that filters undesired components from the phase error signal and/or frequency error signal from the phase frequency detector before transmission to a voltage-controlled oscillator also inside the PLL device (120). Accordingly, the voltage-controlled oscillator may produce one or more output signals proportional to the phase error signal and/or frequency error signal.

Figure 2:
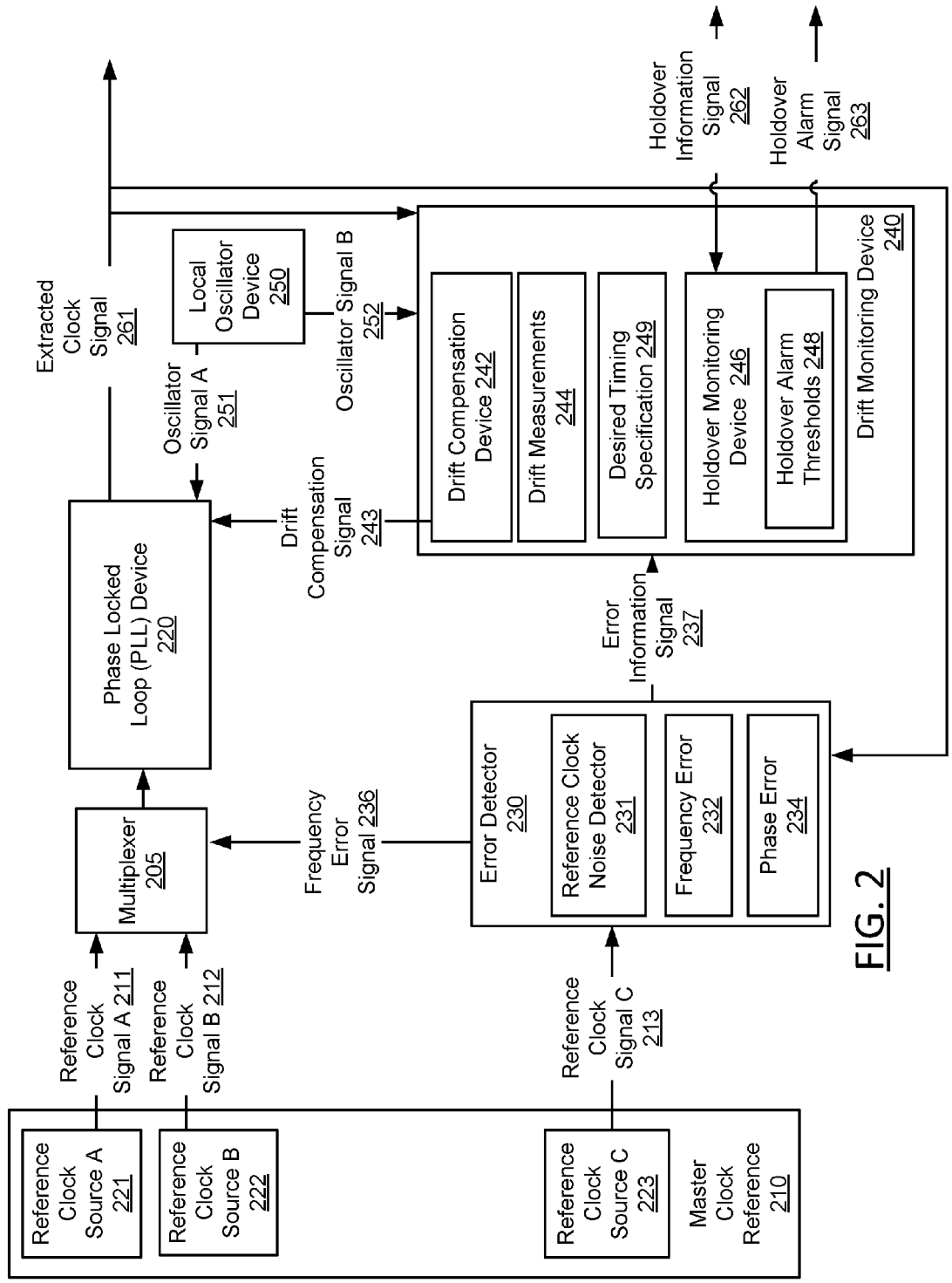

Turning to FIG. 2, a master clock reference (210) is shown operably connected with a PLL device (220) and an error detector (230). The master clock reference (210) may include one or more reference clock sources (e.g., reference clock source A (221), reference clock source B (222), reference clock source C (223)). Specifically, a reference clock source may be software and/or hardware that includes functionality to provide a particular type of timing information throughout a network. For example, a reference clock source may be a global position system (GPS) device on the master clock reference. Other examples of reference clock sources include implementing a network protocol over a network for synchronizing clocks, such as synchronous Ethernet (SyncE), or implementing a precision time protocol (PTP), e.g., with respect to the IEEE 1588 standard, between the master clock reference (210) and the error detector (230) and/or the PLL device (220).

Furthermore, the clock reference sources (221, 222, 223) may include functionality to transmit timing information over one or more reference clock signals (e.g., reference clock signal A (211), reference clock signal B (212), reference clock signal (213)) through a multiplexer (MUX) (205) to the PLL device (220) and/or the error detector (230). The MUX (205) may be hardware and/or software that includes functionality to select one of the reference clock signals (211, 212) or the frequency error signal (236) from the error detector (230) described below, and then pass the selected reference clock signal to the PLL device (220) for adjusting the extracted clock signal (261). While the MUX (205) is shown external to the PLL device (220), the MUX (205) may also be located inside the PLL device (220) and/or one or more additional multiplexers may be used to select a reference clock signal. Furthermore, a combination of the reference clock signals (211, 212) and/or the frequency error signal (236) may be used by the PLL device (220) to adjust the extracted clock signal (261) for frequency and phase, i.e., one signal for phase and a different signal for frequency. Depending on which of the reference clock signals (211, 212) is selected for the PLL device (220), different drift measurements may be computed by the drift monitoring device (240) and/or drift compensation functionality may be applied by the drift compensation device (242). While the clock reference sources (221, 222, 223) are shown inside the master clock reference (210), in one or more embodiments, the clock references sources (221, 222, 223) may be distributed among various remote devices on a network and/or outside the network.

During periods of time when the PLL device (220) and/or the error detector (230) are disconnected from the master clock reference (210), the PLL device (220) may enter holdover. During holdover or termination of communication between the master clock reference (210) and the PLL device (220), the PLL device (220) may switch to using an oscillator signal A (251) from the local oscillator device (250) instead of one of reference clock signals (211, 212) for synchronizing the extracted clock signal (261). The local oscillator device (250) may include various types of oscillators, such as an oven-controlled crystal oscillator (OCXO). In particular, various embodiments may be directed to less stable types of oscillators, such as those types of oscillators which undergo oscillator drift due to aging.

The error detector (230) may be software and/or hardware that includes functionality to detect an amount of phase error (234) and/or an amount of frequency error (232) in the extracted clock signal (261) using the reference clock signal C (213). Specifically, the reference clock signal C (213) may be a packet input that includes frequency information and/or phase information encapsulated in packets regarding the reference clock source C (223). On the other hand, reference clock signals (211, 212) may be non-packet inputs. Reference clock signals using non-packet inputs may provide greater precision regarding drift measurements obtained regarding the local oscillator device (250).

Furthermore, the error detector (230) may include functionality to produce a frequency error signal (e.g., frequency error signal (236)) from the extracted clock signal (261) and the referenced clock signal C (213). The frequency error signal (236) may be transmitted to the PLL device (220), e.g., through MUX (205), to synchronize the extracted clock signal (261) with a reference clock signal C (213) from the master clock reference (210). In particular, the frequency error signal (236) may be a voltage signal that corresponds to a difference in frequency between the extracted clock signal (261) and the reference clock signal C (213). The frequency error signal (236) may cause the extracted clock signal (261) to increase or decrease in frequency, accordingly. A phase error signal (not shown) may also be transmitted from the error detector (230) to the PLL device (220) for adjusting the extracted clock signal (261).

In one or more embodiments, the error detector (230) includes a reference clock noise detector (231). The reference clock noise detector (231) may be software and/or hardware that includes functionality to determine an amount of noise in the reference clock signal C (213). For example, the phase and frequency information carried in a packet input may include noise, which may be measured by reference clock noise detector (231). The amount of noise may be stored in memory or in a storage device as reference clock noise measurements. While the reference clock noise detector (231) is shown inside the error detector (230), in other embodiments, the reference clock noise detector (231) may be a separate device from the error detector (230).

Keeping with FIG. 2, the PLL device (220) may include an internal error detector that the PLL device (220) uses to align to one of the reference clock signals (211, 212). On the other hand, if the error detector (230) is used to adjust the extracted clock signal (261), the internal error detector inside PLL device (220) may be disabled, while the PLL device (120) may set the frequency of the extracted clock signal (261) based on a value transmitted in the frequency error signal (236).

In one or more embodiments, the drift monitoring device (240) includes software and/or hardware to implement functionality for monitoring oscillator drift with respect to the local oscillator device (250). Specifically, oscillator drift may include shifting of an operating frequency of the local oscillator device (250) as a frequency offset over time. In other words, for example, the nominal frequency of oscillator signal A (251) or oscillator signal B (252) from the local oscillator device (250) may change over time due to temperature effects that alter the piezoelectric effect of materials inside the local oscillator device (250). In one or more embodiments, based on the frequency error (232) and/or phase error (234) of the extracted clock signal (261), the drift monitoring device (240) may obtain an error information signal (e.g., error information signal (237)) from the error detector (230) for monitoring oscillator drift. The error information signal (237) may include information regarding noise measurements in reference clock signal C (213), for example. In one or more embodiments, the amount of oscillator drift in the local oscillator device (250) may be stored in memory or a storage device (not shown) as drift measurements (244) inside the drift monitoring device (240). While the drift monitoring device (240) is shown separate from the error detector (230), in one or more embodiments, the drift monitoring device (240) and the error detector (230) are implemented together in hardware and/or software.

Keeping with FIG. 2, in one or more embodiments, the drift monitoring device (240) includes a drift compensation device (242). The drift compensation device (242) may be software and/or hardware that includes functionality to generate a drift compensation signal (243) that compensates the extracted clock signal (261) for oscillator drift. In one or more embodiments, for example, the drift compensation signal (243) is configured by the drift compensation device (242) to adjust the extracted clock signal (261) for a portion of the frequency error (232) resulting from oscillator drift in the oscillator signal (251). Thus, during holdover, the drift compensation device (242) may include functionality to switch on the drift compensation signal (243) for transmission to the PLL device (220) to keep the extracted clock signal (261) in synchronization with the rest of the other computing systems on a network (not shown). In one or more embodiments, a drift compensation signal (243) compensates for oscillator drift in the PLL device (220), while the PLL device (220) is connected to the master clock reference (210). While the drift compensation device (242) is shown inside the drift monitoring device (240), in one or more embodiments, the drift compensation device (242) is a separate component inside a computing system.

Furthermore, in one or more embodiments, the drift monitoring device (240) includes a holdover monitoring device (246). The holdover monitoring device (246) may be software and/or hardware that includes functionality to determine an amount of time that the extracted clock signal is within a desired timing specification (249) during holdover. For example, the desired timing specification (249) may be a specified amount of clock cycle error between the extracted clock signal (261) and various timing requirements of other computing systems in a network. In other words, the desired timing specification (249) may describe when the extracted clock signal (261) is out-of-spec. In another example, the desired timing specification may be a predefined amount of frequency error and/or phase error in the extracted clock signal (261) before the extracted clock signal (261) is outside the desired timing specification (249). Thus, the desired timing specification (249) may specify one or more timing characteristics for determining whether the extracted clock signal (261) is synchronized with the master clock reference (210) and/or another computing system on the network. In one or more embodiments, for example, the holdover monitoring device (246) includes functionality to use the error signal B (237) to determine whether the extracted clock signal (261) is within the desired timing specification (249).

In one or more embodiments, the holdover monitoring device (246) includes one or more holdover alarm thresholds (248). A holdover alarm threshold may specify a point in time during holdover before the extracted clock signal (261) is outside the desired timing specification (249). For example, the holdover alarm thresholds (248) may include different amounts of frequency error and/or phase error during holdover that correspond to different amounts of time during holdover. In one or more embodiments, when one of the holdover alarm thresholds (248) is reached, the holdover monitoring device (246) includes functionality to transmit a holdover alarm signal (263) to a computing device, such as computing device (170) in FIG. 1. The holdover alarm signal (263) may be a voltage signal indicating to the computing device that the holdover alarm threshold has been reached. For example, the holdover alarm signal (263) may include holdover information identifying the amount of remaining time in holdover before the extracted clock signal (261) is outside the desired timing specification.

In one or more embodiments, the holdover monitoring device (246) includes functionality to receive and/or transmit a holdover information signal (262) to the computing device. The holdover information signal (262) may be a voltage signal that describes holdover information regarding the extracted clock signal (261) during holdover. In one or more embodiments, holdover information may describe one or more characteristics of a computing system during holdover, e.g., a remaining amount of time that a computing system may be synchronized with other network elements in a network. For example, the computing device may update one of the holdover alarm thresholds (248) using the holdover information signal (262). While the holdover monitoring device (246) is shown inside the drift monitoring device (240), in one or more embodiments, the holdover monitoring device (246) is a separate component inside a computing system.

While FIGS. 1 and 2 show various configurations of components, other configurations may be used without departing from the scope of the invention. For example, various components may be combined to create a single component. As another example, the functionality performed by a single component may be performed by two or more components.

Figure 3:
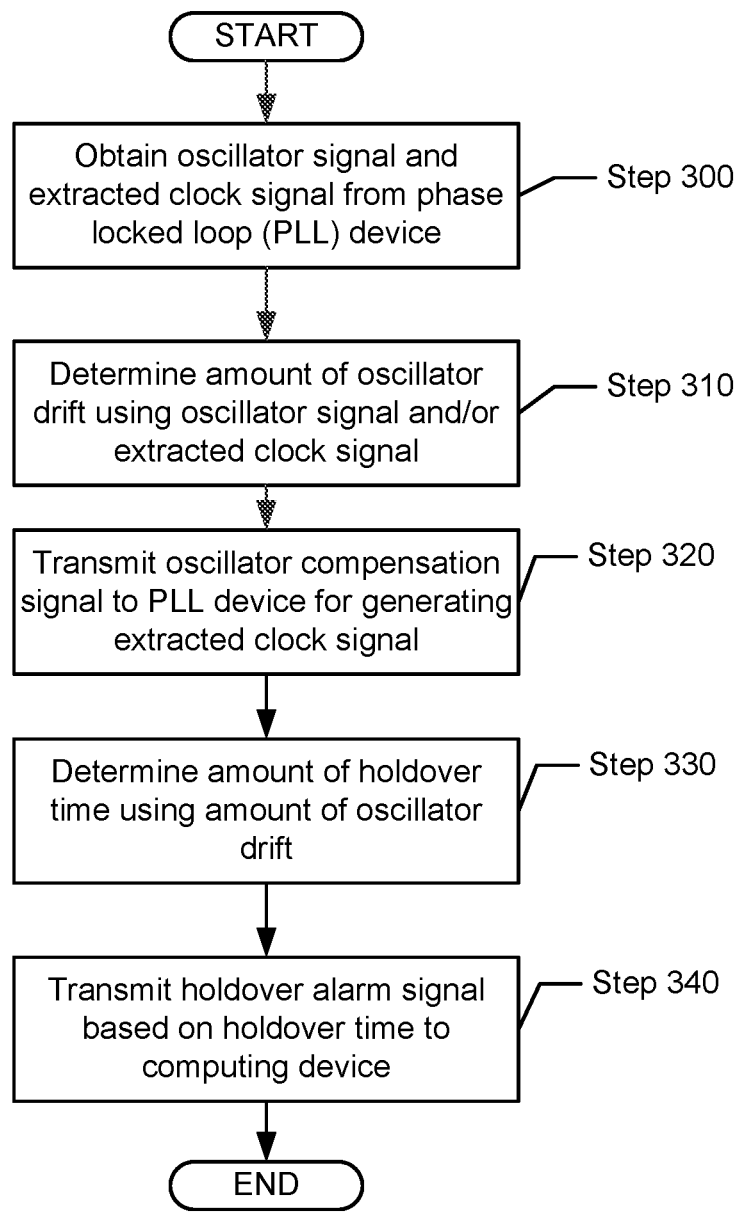
FIGS. 3, 4, and 5 show flowcharts in accordance with one or more embodiments.

FIG. 3 shows a flowchart in accordance with one or more embodiments. Specifically, one or more steps in FIG. 3 may be performed by a computer system as described in FIG. 1. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 300, an oscillator signal and/or an extracted clock signal is obtained in accordance with one or more embodiments. In particular, a drift monitoring device may obtain an oscillator signal directly from a local oscillator device and the extracted clock signal directly from a PLL device. On the other hand, in one or more embodiments, the PLL device may buffer or repeat the oscillator signal to the drift monitoring device, e.g., using an output pin on the PLL device. In one or more embodiments, the oscillator signal may be stored in a software register inside the PLL device that the drift monitoring device reads to obtain information regarding the oscillator signal and/or the extracted clock signal.

In Step 310, an amount of oscillator drift of a local oscillator device is determined using the oscillator signal and/or extracted clock signal in accordance with one or more embodiments. For example, using the oscillator signal and/or extracted clock signal from Step 300, the amount of oscillator drift may be measured for a local oscillator device. In particular, the amount of oscillator drift may correspond to an amount of frequency error in the extracted clock signal. Thus, the amount of frequency error may be accumulated over time as a measurement of the amount of oscillator drift. On the other hand, the amount of frequency error may be used as an input to a function, e.g., a weighted function, for calculating the amount of oscillator drift. In one or more embodiments, the amount of oscillator drift is measured during holdover as well as while the PLL device is connected to a master clock reference.

In Step 320, an oscillator compensation signal is transmitted to a PLL device for generating an extracted clock signal in accordance with one or more embodiments. When holdover is detected for a PLL device, a drift compensation device may begin generating a drift compensation signal. In particular, the drift compensation signal may compensate for an amount of oscillator drift in an oscillator signal from a local oscillator device. Thus, the drift compensation signal may allow the PLL device to continue to produce an extracted clock signal within a desired timing specification that accounts for a portion of the frequency error in the oscillator signal. For more information regarding compensating for oscillator drift during holdover, see FIG. 4 and the accompanying description.

In Step 330, an amount of holdover time is determined using an amount of oscillator drift in accordance with one or more embodiments. Using the amount of oscillator drift from Step 310, an amount of holdover time may be determined before an extracted clock signal is outside a desired timing specification. For example, a drift monitoring device or a holdover monitoring device may calculate a specific time (e.g., 5 hours after entering holdover) or a range of time (e.g., between 30 minutes and 2 hours after entering holdover) when the extracted clock signal leaves the desired timing specification.

In Step 340, a holdover alarm signal based on an amount of holdover time is transmitted to a computing device in accordance with one or more embodiments. Using the amount of holdover time determined in Step 330, a holdover monitoring device may determine how much time remains during holdover before the extracted clock signal is outside a desired timing specification. In one or more embodiments, the holdover alarm signal is triggered using a holdover alarm threshold. For example, the holdover alarm threshold may be based on an amount of oscillator drift determined while a PLL device is connected to the master clock reference. Once the PLL device enters holdover, the holdover monitoring device may use the holdover alarm threshold to determine when to send the holdover alarm signal to the computing device. In response to obtaining the holdover alarm signal, the computing device may notify a user when the extracted clock signal may be outside the desired timing specification. For example, the computing device may present holdover information regarding the remaining amount of holdover time on a display device. For more information regarding the operation of a holdover alarm during holdover, see FIG. 5 and the accompanying description.

Figure 4:
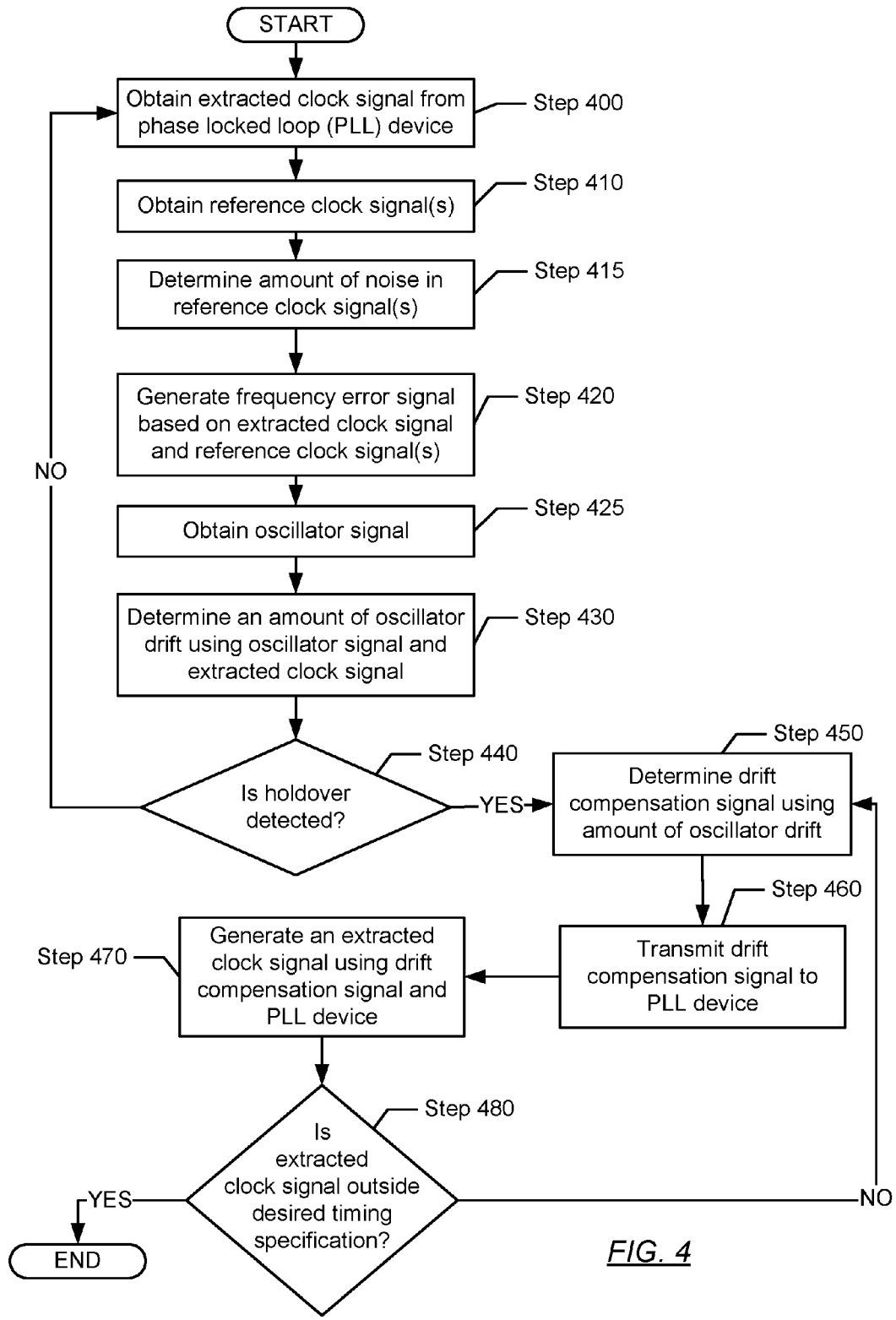

FIG. 4 shows a flowchart in accordance with one or more embodiments. Specifically, one or more steps in FIG. 4 may be performed by a computer system as described in FIG. 1. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 400, an extracted clock signal is obtained from a PLL device in accordance with one or more embodiments. In particular, an error detector and/or a drift monitoring device may obtain an extracted clock signal as an input from the PLL device. The PLL device may be similar to the PLL device described with respect to FIGS. 1 and 2.

In Step 410, one or more reference clock signals are obtained in accordance with one or more embodiments. For example, an error detector and/or a PLL device may be operably connected with a master clock reference over a network. As such, a reference clock signal may be transmitted from the master clock reference to the error detector.

In Step 415, an amount of noise may be determined with respect to one or more reference signals in accordance with one or more embodiments. For example, a reference clock noise detector may analyze the amount of noise in the reference clock signals obtained in Step 410. For example, if the reference clock signal corresponds to a IEEE 1588 clock reference source, the reference clock noise detector may determine the amount of packet delay variation in the corresponding clock reference signal.

In Step 420, a frequency error signal is generated based on one or more reference clock signals and an extracted clock signal in accordance with one or more embodiments. An error detector may use the extracted clock signal from Step 400 and one or more of the reference clock signals from Step 410 to determine an amount of frequency error in an extracted clock from Step 400. The frequency error signal may be similar to frequency error signal generated by an error detector described in FIG. 2. The frequency error signal may also correspond to an internal error detector located in a PLL device. Thus, before holdover, the frequency of the extracted clock signal may be matched to the frequency of one of the reference clock signals from Step 410.

In Step 425, an oscillator signal is obtained in accordance with one or more embodiments. In one or more embodiments, the oscillator signal is obtained in a similar manner as described in Step 300 and the accompanying description.

In Step 430, an amount of oscillator drift is determined using an oscillator signal and an extracted clock signal in accordance with one or more embodiments. Specifically, an amount of oscillator drift may be measured with respect to a local oscillator device operably connected to a PLL device. For example, a drift monitoring device may measure a frequency offset between an extracted clock signal in steady state and an oscillator signal to determine an amount of oscillator drift in the local oscillator device. Using this frequency offset, an amount of oscillator drift may be computed accordingly. In particular, the amount of oscillator drift may be stored as drift measurements in the drift monitoring device, e.g., as a register value in the drift monitoring device, or the drift measurements may be offloaded to a computing device.

In one or more embodiments, a drift monitoring device records a history of oscillator drift for the local oscillator device. For example, the drift monitoring device may measure how the oscillator drift changes over time, e.g., as a function of time for a specified period of time.

In one or more embodiments, oscillator drift is measured based on the amount of noise in a clock reference signal as determined in Step 415. In one or more embodiments, the drift monitoring device adjusts the speed at which the oscillator drift is tracked based on this amount of noise. For example, if a high amount of noise is being measured in the clock reference signal, the drift monitoring device may forgo measuring the amount of oscillator drift until the amount of noise decreases below a predetermined noise threshold. If a computing system enters holdover before the amount of noise drops below the noise threshold, then the drift monitoring device and/or a drift compensation device may use the amount of oscillator drift measured during the last low noise period for the clock reference signal.

In Step 440, a determination is made whether holdover is detected in accordance with one or more embodiments. In particular, a computing system may detect whether a connection exists between the computing system and a master clock reference. For example, a PLL device and/or an error detector inside the computing system may determine that the connection has terminated if a reference clock signal is not received within a predetermined period of time. On the other hand, the computing system may transmit a request for an acknowledgement from the master clock reference. If no acknowledgement is received with respect to the request, then the computing system may determine that the PLL device has entered holdover. On the other hand, if an acknowledgement is received and/or a reference clock signal is obtained by the PLL device, then the computing system may determine that holdover has not been detected. In one or more embodiments, once holdover is detected, a drift monitoring device may stop measuring the amount of oscillator drift. When a determination is made that holdover is detected, the process may proceed to Step 450. When a determination is made that the computing system is connected to a master clock reference, the process proceeds to Step 400.

In Step 450, a drift compensation signal is determined using an amount of oscillator drift in accordance with one or more embodiments. In response to determining a computing system is in holdover, a drift compensation device may switch to generating a drift compensation signal for a PLL device. In one or more embodiments, the drift compensation signal adjusts a frequency offset of an oscillator signal from a local oscillator device for the amount of oscillator drift determined in Step 430.

In one or more embodiments, for example, once holdover is detected, the last extracted clock signal is used by the PLL device during the holdover. This is because the frequency of the last extracted clock signal may approximately match the frequency of the last reference clock signal from a master clock reference. If there was no frequency error resulting from oscillator drift, the PLL device may hold at a particular frequency error forever, which may result in a holdover with a desired timing specification forever. With frequency error from the oscillator drift, the drift monitoring device may use the last drift measurement obtained for the last extracted clock signal to compensate for the frequency error.

In one or more embodiments, the drift monitoring device uses a predictive algorithm regarding future oscillator drift associated with the local oscillator device. In other words, where the oscillator drift is not constant, the drift monitoring device may extrapolate a value of the oscillator drift using the history of the oscillator drift. Based on the current period of time in holdover, the drift compensation device may determine a corresponding compensation signal based on such an extrapolated oscillator drift value.

In Step 460, a drift compensation signal is transmitted to a PLL device in accordance with one or more embodiments. In particular, the drift compensation signal from Step 450 may be transmitted to a PLL device during holdover in order to tune an extracted clock signal outputted by the PLL device. For example, the drift compensation signal may adjust the frequency of the extracted clock signal to account for frequency error within an oscillating signal from a local oscillator device. Accordingly, the drift compensation signal may reduce the amount of frequency error associated with the oscillating signal that is due to oscillator drift.

In Step 470, an extracted clock signal is generated using a drift compensation signal and a PLL device in accordance with one or more embodiments. In response to obtaining the drift compensation signal in Step 460, a PLL device may produce an extracted clock signal within a desired timing specification during holdover.

In Step 480, a determination is made whether the extracted clock signal is outside a desired timing specification in accordance with one or more embodiments. Specifically, a threshold amount of frequency error and/or phase error may be specified for the extracted clock signal. Thus, when the drift compensation signal from Step 460 fails to produce an extracted clock signal below a threshold amount, the extracted clock signal may be designated as being outside the desired timing specification. For example, the threshold amount of phase error may be a maximum time interval error (MTIE) value specifying a maximum difference in time periods between a reference clock signal and the extracted clock signal. When a determination is made that the extracted clock signal is outside the desired timing specification, the process may end. When a determination is made that the extracted clock signal is within the desired timing specification, the process proceeds to Step 450.

In one or more embodiments, compensation of oscillator drift during holdover provides a computing system with the capability to increase the amount of time that an extracted clock signal is within a desired timing specification. In other words, the computing system may compensate for physical characteristics and environmental conditions specific to a particular local oscillator device inside the computing system during operation of the computing system in the field. Without compensation of oscillator drift during holdover, a generic worst-case scenario may be estimated at the manufacturing level that may not be accurate for the local oscillator device.

Figure 5:
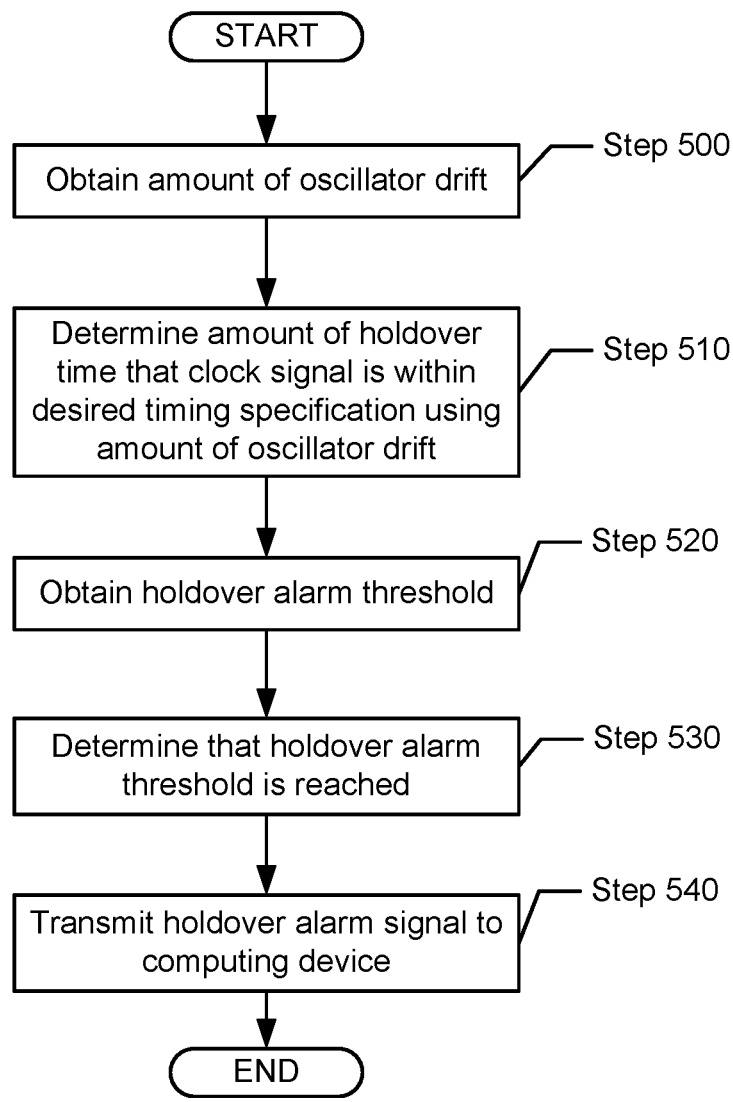

FIG. 5 shows a flowchart in accordance with one or more embodiments. Specifically, one or more steps in FIG. 5 may be performed by a computer system as described in FIG. 1. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 500, an amount of oscillator drift is obtained in accordance with one or more embodiments. In particular, the amount of oscillator drift may be measured with respected to a local oscillator device operably connected with a PLL device. In one or more embodiments, for example, the amount of oscillator drift is obtained in a similar manner as the amount of oscillator drift is determined in Step 430. A drift monitoring device may be used, for example, to obtain drift measurements with respect to the local oscillator device.

In Step 510, an amount of holdover time is determined, using an amount of oscillator drift, regarding a clock signal being within a desired timing specification in accordance with one or more embodiments. In one or more embodiments, a holdover monitoring device is used to compute an amount of holdover time with respect to an extracted clock signal from a PLL device. In one or more embodiments, for example, the amount of holdover time may correspond to an amount of time before oscillator drift in a local oscillator device moves the frequency of the clock signal outside the desired timing specification. In another example, the amount of holdover time may be calculated using the last drift measurement of the local oscillator device. In another embodiment, a predictive algorithm in the holdover monitoring device may be used to determine the amount of holdover time before the clock signal is outside the desired timing specification.

In one or more embodiments, the amount of oscillator drift for determining the amount of holdover time is selected based on the amount of noise in a clock reference signal. For example, the amount of holdover time may be determined during a time period when a reference clock signal has a low amount of noise.

In Step 520, a holdover alarm threshold is obtained in accordance with one or more embodiments. In one or more embodiments, a holdover monitoring device determines a specific holdover alarm threshold from the amount of holdover time determined in Step 510. For example, if the holdover monitoring device is designated to automatically notify a user an hour before the PLL device is outside a desired timing specification, the holdover monitoring device may compute a point in time during holdover that the extracted clock signal reaches the amount of oscillator drift. In one or more embodiments, the holdover monitoring device uses the amount of oscillator drift from Step 500 to calculate the holdover alarm threshold.

In one or more embodiments, the holdover alarm threshold is a value obtained from a computing device. The value may specify an amount of frequency error and/or phase error in an extracted clock signal from a PLL device. Specifically, the computing device may transmit the value of the holdover alarm threshold to the holdover monitoring device. As such, the holdover monitoring device may accordingly calculate the point in time during holdover that the extracted clock signal reaches the holdover alarm threshold.

In Step 530, a determination is made that a holdover alarm threshold is reached in accordance with one or more embodiments. In particular, the holdover monitoring device may monitor an extracted clock signal from a PLL device until the holdover alarm threshold is reached. In one or more embodiments, the holdover monitoring device determines an amount of time between detecting that holdover is initiated and a predicted time when the holdover alarm threshold is reached. Accordingly, the holdover monitoring device may merely countdown the time until the holdover alarm threshold is reached.

In Step 540, a holdover alarm signal is transmitted to a computing device in accordance with one or more embodiments. In response to determining that the holdover alarm threshold is reached in Step 530, for example, the holdover monitoring device may transmit a holdover alarm signal to the computing device. The holdover alarm signal may be a notification that a specific time during holdover is reached. In one or more embodiments, the holdover alarm signal describes the amount of time remaining before an extracted clock signal is outside a desired timing specification. On the computing device, an alarm may be triggered that the extracted clock signal may be outside the desired timing specification within a specific amount of time, and an alarm message may be presented on a display device accordingly.

In one or more embodiments, a holdover alarm implemented on a network element provides holdover information to one or more other network elements on a network. For example, the network element may report, over the network, the amount of time that the network element can remain within the desired timing specification during holdover. Moreover, the network element may transmit the holdover alarm signal or holdover information regarding the holdover alarm signal to a network management system (NMS) or a software-defined network (SDN) controller on the network. At the NMS or SDN controller, the holdover information or holdover alarm signal may be used to determine the current and/or future status of holdover for network elements throughout the network. For example, the NMS or SDN controller may monitor and/or control network operations between network elements based on the amounts of time that various network elements may have during holdover. For another example, the NMS or SDN controller may give priority for various network operations to those network elements with less time within a desired timing specification.

In one or more embodiments, the holdover alarm signal may provide information throughout a network before a network element enters holdover. Specifically, a network may organize and administer various network elements within the network in preparation for holdover. For example, if a network element is required to go offline for maintenance, an online network element may consequently be disconnected from a master clock reference. Thus, a holdover alarm signal may provide information in advance of the network element going offline that may allow precautions to be taken, e.g., the amount of time that can be devoted to maintenance, before the online network element is outside the desired timing specification.

Figure 6:
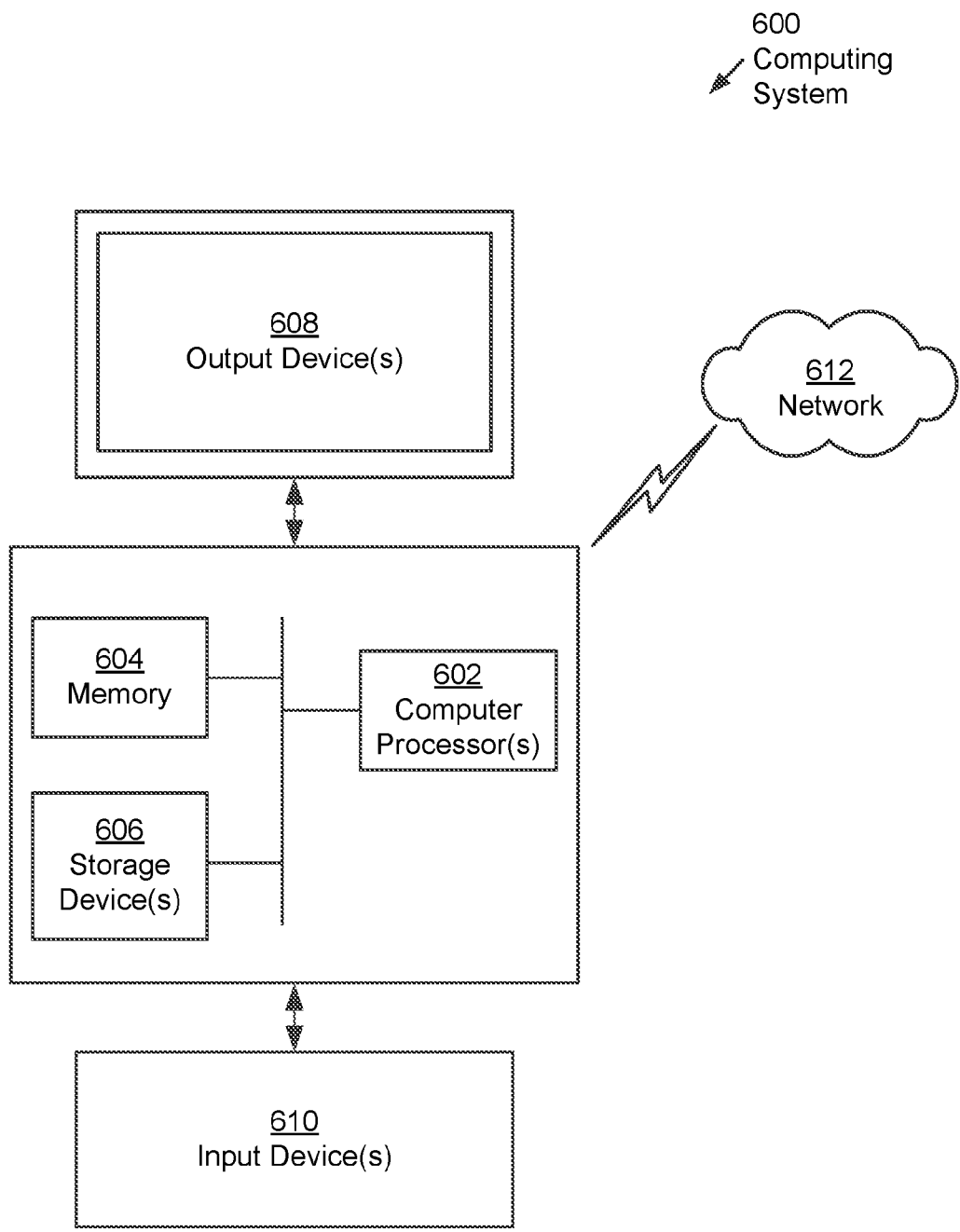
FIG. 6 shows a computing system in accordance with one or more embodiments.

Embodiments may be implemented on a computing system. Any combination of mobile, desktop, server, router, switch, network element, embedded, or other types of hardware may be used. For example, as shown in FIG. 6, the computing system (600) may include one or more computer processors (602), associated memory (604) (e.g., random access memory (RAM), cache memory, flash memory, etc.), one or more storage device(s) (606) (e.g., a hard disk, an optical drive such as a compact disk (CD) drive or digital versatile disk (DVD) drive, a flash memory stick, etc.), and numerous other elements and functionalities. The computer processors (602) may be an integrated circuit for processing instructions. For example, the computer processors may be one or more cores, or micro-cores of a processor. The computing system (600) may also include one or more input devices (610), such as a touchscreen, keyboard, mouse, microphone, touchpad, electronic pen, or any other type of input device. Further, the computing system (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The computing system (600) may be connected to a network (612) (e.g., a local area network (LAN), a wide area network (WAN) such as the Internet, mobile network, or any other type of network) via a network interface connection (not shown). The input and output device(s) may be locally or remotely (e.g., via the network (612)) connected to the computer processor(s) (602), memory (604), and storage device(s) (606). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (600) may be located at a remote location and connected to the other elements over a network (612). Further, embodiments of the invention may be implemented on a distributed system having a plurality of nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for managing holdover, comprising:
a local oscillator device;
a phase locked loop (PLL) device coupled to the local oscillator device and a first reference clock source, wherein the PLL device is configured to obtain a first reference clock signal from the first reference clock source to produce an extracted clock signal;
a drift monitoring device coupled to the local oscillator device and the PLL device, wherein the drift monitoring device is configured to determine an amount of oscillator drift within the local oscillator device using the extracted clock signal and an oscillator signal from the local oscillator device; and
a drift compensation device coupled to the drift monitoring device and the PLL device, wherein the drift compensation device is configured to transmit a drift compensation signal to the PLL device based on the amount of oscillator drift.

2. The system of claim 1, further comprising:
a holdover monitoring device coupled to the drift monitoring device, wherein the holdover monitoring device is configured to transmit, to a computer device, a holdover alarm signal indicating the extracted clock signal is outside a desired timing specification.

3. The system of claim 2,
wherein the holdover monitoring device is configured to trigger the holdover alarm signal when a holdover alarm threshold expires, and
wherein the holdover alarm threshold corresponds to an amount of time before the extracted clock signal is outside the desired timing specification for the extracted clock signal.

4. The system of claim 1, further comprising:
an error detector coupled to the PLL device and a second reference clock source,
wherein the error detector is configured to generate, using a second reference clock signal from the second reference clock source, a frequency error signal for the PLL device.

5. The system of claim 4, further comprising:
a reference clock noise detector coupled to the second reference clock source and the drift monitoring device,
wherein the reference clock noise detector is configured to determine an amount of noise in the second reference clock signal, and
wherein the drift monitoring device is further configured to adjust, using the amount of noise, the amount of oscillator drift.

6. The system of claim 1,
wherein the first reference clock source is located on a master clock reference on a network,
wherein the first reference clock source is configured to transmit the first reference clock signal to the PLL device over a connection between the master clock reference and the PLL device over the network, and
wherein the drift compensation device is further configured to transmit the drift compensation signal to the PLL device after the connection is terminated.

7. The system of claim 1,
wherein the amount of oscillator drift corresponds to a shifting of an operating frequency of the local oscillator device resulting from temperature effects to the local oscillator device.

8. The system of claim 1,
wherein the local oscillator device is an oven-controlled crystal oscillator (OCXO).

9. A method for managing holdover, comprising:
obtaining an oscillator signal from a local oscillator device;
obtaining a first extracted clock signal from a phase locked loop (PLL) device;
determining, using the oscillator signal and the first extracted clock signal, an amount of oscillator drift for the local oscillator device;
detecting that a connection is terminated over a network between the PLL device and a master clock reference;

determining, in response to detecting that the connection is terminated and using the amount of oscillator drift, a drift compensation signal;

transmitting the drift compensation signal to the PLL device; and generating, from the PLL device and using the drift compensation signal, a second extracted clock signal, wherein the drift compensation signal compensates the second extracted clock signal for the amount of oscillator drift.

10. The method of claim 9, further comprising:

obtaining, at an error detector, a reference clock signal and the first extracted clock signal to generate a frequency error signal for the PLL device, wherein the frequency error signal compensates for frequency error in the first extracted clock signal;

determining an amount of noise in the reference clock signal; and adjusting, using the amount of noise, a period in time when the amount of oscillator drift is measured for producing the drift compensation signal.

11. The method of claim 9, further comprising:

obtaining, at the PLL device, a first reference clock signal from the master clock reference;

obtaining, at an error detector, a second reference clock signal from the master clock reference; and generating, at the error detector, a frequency error signal for the PLL device, wherein the frequency error signal compensates for frequency error in the first extracted clock signal.

12. The method of claim 11, wherein the first reference clock signal is from a global positioning system (GPS) source on the master clock reference, and wherein the second reference clock signal is from synchronous ethernet (SyncE) implemented by the master clock reference over the network.

13. The method of claim 9, wherein the amount of the oscillator drift corresponds to a shifting of an operating frequency of the local oscillator device resulting from temperature effects to the local oscillator device.

14. The method of claim 9, wherein the local oscillator device is an oven-controlled crystal oscillator (OCXO).

\* \* \* \* \*